United States Patent
Frisina et al.

(10) Patent No.: US 8,921,211 B2
(45) Date of Patent: Dec. 30, 2014

(54) VERTICAL-CONDUCTION INTEGRATED ELECTRONIC DEVICE AND METHOD FOR MANUFACTURING THEREOF

(71) Applicant: STMicroelectronics S.r.l., Agrate Brianza (IT)

(72) Inventors: Ferruccio Frisina, S. Agata Li Battiati (IT); Mario Giuseppe Saggio, Aci Bonaccorsi (IT); Angelo Magri', Belpasso (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/166,522

(22) Filed: Jan. 28, 2014

(65) Prior Publication Data

US 2014/0141603 A1    May 22, 2014

Related U.S. Application Data

(62) Division of application No. 13/221,694, filed on Aug. 30, 2011, now Pat. No. 8,653,590.

(30) Foreign Application Priority Data

Aug. 30, 2010 (IT) .............................. TO2010A0723

(51) Int. Cl.
*H01L 21/02* (2006.01)
*H01L 21/04* (2006.01)
(Continued)

(52) U.S. Cl.
CPC ........ *H01L 21/02573* (2013.01); *H01L 21/046* (2013.01); *H01L 29/1095* (2013.01); *H01L 29/267* (2013.01); *H01L 29/66068* (2013.01);
(Continued)

(58) Field of Classification Search
CPC ................ H01L 21/046; H01L 21/265; H01L 21/02573; H01L 29/267

USPC ................... 438/508, 270; 257/330–333, 341
See application file for complete search history.

(56) References Cited

U.S. PATENT DOCUMENTS

| | | | |
|---|---|---|---|
| 4,074,293 | A | 2/1978 | Kravitz |
| 5,272,096 | A | 12/1993 | de Fresart et al. |

(Continued)

FOREIGN PATENT DOCUMENTS

| | | |
|---|---|---|
| EP | 0726604 | 8/1996 |
| EP | 1263052 | 12/2002 |

(Continued)

OTHER PUBLICATIONS

Search Report for Italian Application No. TO20100723, Ministero dello Sviluppo Economico, Munich, Feb. 8, 2011, pp. 2.

(Continued)

*Primary Examiner* — Nathan Ha
(74) *Attorney, Agent, or Firm* — Allen, Dyer, Doppelt, Milbrath & Gilchrist, P.A.

(57) ABSTRACT

An embodiment of a vertical-conduction integrated electronic device formed in a body of semiconductor material which includes: a substrate made of a first semiconductor material and with a first type of conductivity, the first semiconductor material having a first bandgap; an epitaxial region made of the first semiconductor material and with the first type of conductivity, which overlies the substrate and defines a first surface; and a first epitaxial layer made of a second semiconductor material, which overlies the first surface and is in direct contact with the epitaxial region, the second semiconductor material having a second bandgap narrower than the first bandgap. The body moreover includes a deep region of a second type of conductivity, extending underneath the first surface and within the epitaxial region.

6 Claims, 11 Drawing Sheets

(51) Int. Cl.
  *H01L 29/10*    (2006.01)
  *H01L 29/267*   (2006.01)
  *H01L 29/66*    (2006.01)
  *H01L 29/732*   (2006.01)
  *H01L 29/737*   (2006.01)
  *H01L 29/78*    (2006.01)
  *H01L 29/861*   (2006.01)
  *H01L 29/872*   (2006.01)
  *H01L 21/265*   (2006.01)
  *H01L 29/06*    (2006.01)
  *H01L 29/08*    (2006.01)
  *H01L 29/16*    (2006.01)

(52) U.S. Cl.
  CPC .......... *H01L 29/732* (2013.01); *H01L 29/7371* (2013.01); *H01L 29/7802* (2013.01); *H01L 29/7813* (2013.01); *H01L 29/861* (2013.01); *H01L 29/872* (2013.01); *H01L 21/265* (2013.01); *H01L 29/0619* (2013.01); *H01L 29/0821* (2013.01); *H01L 29/0878* (2013.01); *H01L 29/1608* (2013.01)
  USPC ....................................................... 438/508

(56) References Cited

U.S. PATENT DOCUMENTS

| | | | |
|---|---|---|---|
| 5,459,089 A | 10/1995 | Baliga | |
| 5,661,312 A | 8/1997 | Weitzel et al. | |
| 5,877,515 A | 3/1999 | Ajit | |
| 5,903,020 A | 5/1999 | Siergiej et al. | |
| 6,002,143 A | 12/1999 | Terasawa | |
| 6,239,463 B1 | 5/2001 | Williams et al. | |
| 6,331,727 B1 | 12/2001 | Nakajima et al. | |
| 6,593,620 B1 * | 7/2003 | Hshieh et al. | 257/335 |
| 6,605,504 B1 * | 8/2003 | JaiPrakash et al. | 438/243 |
| 7,078,781 B2 | 7/2006 | Hatakeyama et al. | |
| 7,294,860 B2 | 11/2007 | Mazzola et al. | |
| 7,416,929 B2 | 8/2008 | Mazzola et al. | |
| 7,485,895 B2 | 2/2009 | Kaneko | |
| 7,489,011 B2 | 2/2009 | Yilmaz | |
| 7,646,061 B2 | 1/2010 | Hirler | |
| 7,671,383 B2 | 3/2010 | Hayashi et al. | |
| 7,691,711 B2 | 4/2010 | Stum et al. | |
| 7,719,055 B1 | 5/2010 | McNutt et al. | |
| 7,781,786 B2 | 8/2010 | Hayashi et al. | |
| 7,795,691 B2 | 9/2010 | Zhang et al. | |
| 7,851,274 B1 | 12/2010 | Shah | |
| 7,902,025 B2 | 3/2011 | Hayashi et al. | |
| 7,923,320 B2 | 4/2011 | Ryu | |
| 7,977,210 B2 | 7/2011 | Ota et al. | |
| 7,994,513 B2 | 8/2011 | Yamamoto et al. | |
| 8,188,538 B2 | 5/2012 | Nakano et al. | |
| 8,278,682 B2 | 10/2012 | Yoshikawa et al. | |
| 8,350,317 B2 | 1/2013 | Kocon | |
| 2003/0222327 A1 | 12/2003 | Yamaguchi et al. | |
| 2004/0212011 A1 | 10/2004 | Ryu | |
| 2004/0222458 A1 | 11/2004 | Hsieh et al. | |
| 2005/0269573 A1 | 12/2005 | Seng et al. | |
| 2006/0006394 A1 | 1/2006 | Kordina | |
| 2006/0043379 A1 | 3/2006 | Zhang et al. | |
| 2006/0113593 A1 | 6/2006 | Sankin et al. | |
| 2007/0050530 A1 | 3/2007 | Rajan | |
| 2007/0158658 A1 | 7/2007 | Ryu | |
| 2007/0235745 A1 | 10/2007 | Hayashi et al. | |
| 2008/0150020 A1 | 6/2008 | Challa et al. | |
| 2009/0008709 A1 | 1/2009 | Yedinak et al. | |
| 2009/0085064 A1 | 4/2009 | Rueb et al. | |
| 2009/0278169 A1 | 11/2009 | Hayashi et al. | |
| 2009/0280610 A1 | 11/2009 | Umezaki | |
| 2009/0315039 A1 | 12/2009 | Tsuji | |
| 2010/0001362 A1 | 1/2010 | Van Dalen et al. | |
| 2012/0037980 A1 | 2/2012 | Peake et al. | |
| 2012/0049902 A1 | 3/2012 | Corona et al. | |
| 2012/0049940 A1 | 3/2012 | Frisina et al. | |
| 2012/0056200 A1 | 3/2012 | Frisina et al. | |

FOREIGN PATENT DOCUMENTS

| | | |
|---|---|---|
| EP | 1503425 | 2/2005 |
| EP | 1587147 | 10/2005 |
| JP | 6151867 | 5/1994 |

OTHER PUBLICATIONS

Search Report for Italian Application No. TO20100722, Ministero dello Sviluppo Economico, Munich, Feb. 11, 2011, pp. 2.

Search Report for Italian Application No. TO20100724, Ministero dello Sviluppo Economico, Munich, Feb. 14, 2011, pp. 2.

Mietek Bakowski, Adolf Schöner, Per Ericsson, Helena Ströberg, Hiroyuki Nagasawa, and Masayuki Abe, "Development of 3C-SiC MOSFETs", Journal of Telecommunications and Information Technology, Feb. 2007, pp. 49-56.

M. Grieb, M. Noborio, D. Peters, A. J. Bauer, P. Friedrichs, T. Kimoto and H. Ryssel, "Electrical Characterization of MOS Structures with Deposited Oxides Annealed in N20 or NO", Malerials Science Forum vols. 615-617 (2009) pp. 521-524, 2009 Trans Tech Publications, Switzerland.

\* cited by examiner

VERTICAL-CONDUCTION INTEGRATED ELECTRONIC DEVICE AND METHOD FOR MANUFACTURING THEREOF

PRIORITY CLAIM

The present application is a Divisional of copending U.S. patent application Ser. No. 13/221,694 filed Aug. 30, 2011, which application claims the benefit of Italian Patent Application Serial No. TO2010A000723, filed Aug. 30, 2010, all of the foregoing applications are incorporated herein by reference in their entireties.

RELATED APPLICATION DATA

The instant application is related to U.S. patent application Ser. No. 13/221,733, filed Aug. 30, 2011; and U.S. patent application Ser. No. 13/221,778, filed Aug. 30, 2011; each of the foregoing applications are incorporated herein by reference in their entireties.

TECHNICAL FIELD

An embodiment relates to a vertical-conduction integrated electronic device and to a method for manufacturing thereof.

BACKGROUND

As is known, there are today available numerous electronic devices made at least in part of silicon carbide (SiC).

For example, there are available today metal-oxide semiconductor field-effect transistors (MOSFETs) made at least in part of silicon carbide, which is characterized by a bandgap that is wider than the bandgap of silicon, and hence also by a critical electrical field greater than the critical electrical field of silicon. In fact, typically the critical electrical field of silicon carbide is in the range between approximately 100 V/µm and 400 V/µm, whereas the critical electrical field of silicon is in the range between approximately 20 V/µm and 50 V/µm.

Thanks to its high critical electrical field, silicon carbide enables provision of junctions having breakdown voltages higher than what may be obtained using silicon. Consequently, the use of silicon carbide enables provision of MOSFETs having levels of doping higher than traditional silicon transistors. Furthermore, said MOSFETs may be formed by regions having thicknesses smaller than traditional silicon transistors, and hence are characterized by low on resistances ($R_{on}$).

On the other hand, silicon carbide has a low diffusiveness of the dopant species, even at high temperatures; moreover, as compared to silicon, silicon carbide is characterized by a low (surface) mobility µ of the carriers, which typically does not exceed 50 cm²/Vs. In turn, the low mobility µ of the carriers limits to a certain extent the possibility of obtaining even lower on-resistances.

In order to combine the advantages of silicon and silicon carbide, semiconductor devices have been proposed made both of silicon and of silicon carbide. In this connection, U.S. Pat. No. 5,877,515, which is incorporated by reference, describes a semiconductor device having an epitaxial silicon layer, which is deposited on a silicon-carbide layer, which in turn is deposited on a silicon substrate.

In practice, the silicon-carbide layer enables a concentration of charge to be obtained greater than what may be obtained in the case of a silicon layer, given the same breakdown voltage. However, it is possible that in certain conditions, and in particular in the case where the semiconductor device is biased so as to work in a region of inhibition, a non-negligible electrical field is generated within the epitaxial silicon layer. In said conditions, it is the silicon itself that limits, with its own critical electrical field, the breakdown voltage of the semiconductor device.

SUMMARY

An embodiment is a vertical-conduction integrated electronic device and a manufacturing method that enable the drawbacks of the known art to be overcome, at least in part.

BRIEF DESCRIPTION OF THE DRAWINGS

For a better understanding of the disclosed concepts, embodiments are now described, purely by way of non-limiting example and with reference to the annexed drawings, wherein.

DETAILED DESCRIPTION

Figure 1:
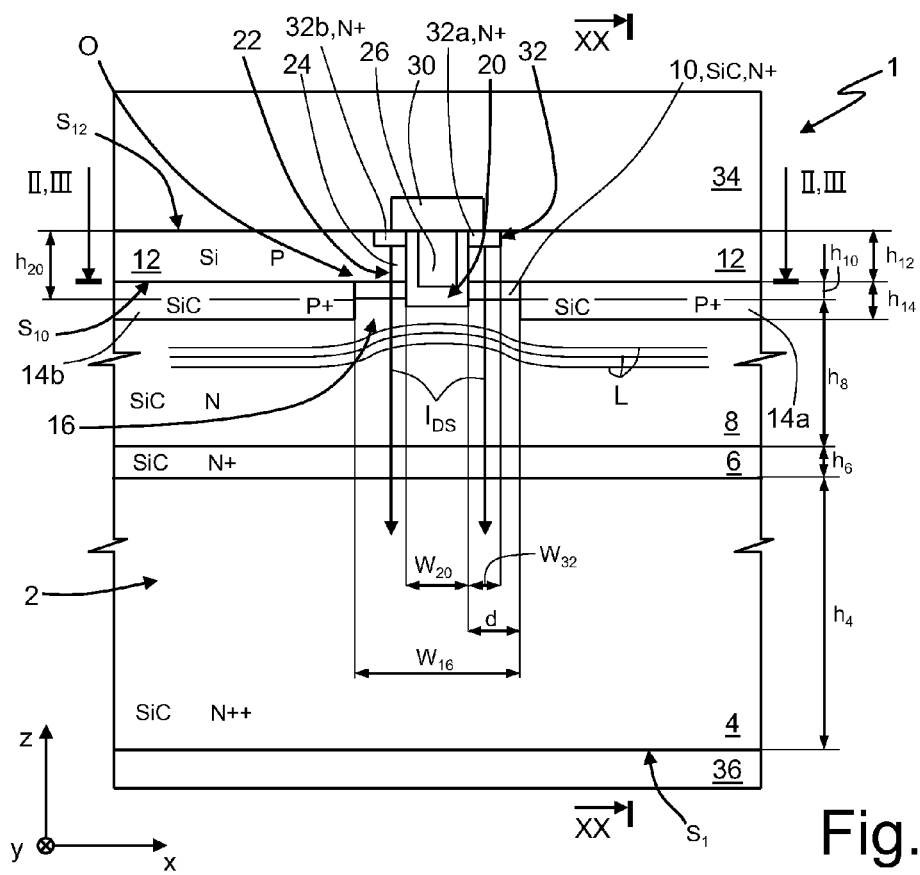
FIG. 1 shows a cross section of a trench MOSFET.

FIG. 1 shows an embodiment of the present vertical-conduction integrated electronic device, which forms, in the case in point, a trench MOSFET 1.

In detail, the trench MOSFET 1 is formed by a body 2 of semiconductor material, which is formed by a substrate 4 of silicon carbide, of an N++ type (for example, doped with nitrogen) and having a bottom surface $S_1$; silicon carbide may be of any polytype (4H, 6H, 3C, etc.). Furthermore, the body 2 includes a buffer layer 6, of an N+ type, as well as a bottom epitaxial layer 8 and an intermediate epitaxial layer 10 of an N type and of an N+ type, respectively.

In detail, the buffer layer 6 is set above the substrate 4, with which it is in direct contact. The bottom epitaxial layer 8 is deposited/grown on top of, and in direct contact with, the buffer layer 6. In addition, the intermediate epitaxial layer 10 is deposited/grown on top of, and in direct contact with, the bottom epitaxial layer 8.

In greater detail, the substrate 4 has a thickness $h_4$, for example, between approximately 100 µm and 600 µm, and moreover has a doping level, for example, between approximately $1 \cdot 10^{18}$ cm$^{-3}$ and $1 \cdot 10^{19}$ cm$^{-3}$.

The buffer layer 6 has a thickness $h_6$, for example equal to approximately 0.5 μm, and moreover has a doping level approximately equal, for example, to approximately $1 \cdot 10^{18}$ cm$^{-3}$.

The bottom epitaxial layer 8 has a thickness $h_8$ and a doping level that affect, as described hereinafter, the maximum voltage that it is possible to apply to the trench MOSFET 1 without causing breakdown thereof, and hence may be chosen as a function of said maximum voltage. For example, if the thickness $h_8$ is approximately 2 μm and the doping level of the bottom epitaxial layer 8 is approximately $1 \cdot 10^{18}$ cm$^{-3}$, then the maximum voltage is between approximately 200 V and 300 V; instead, if the thickness $h_8$ is approximately 6 μm and the doping level of the bottom epitaxial layer 8 is approximately $1 \cdot 10^{16}$ cm$^{-3}$, then the maximum voltage is approximately equal to 800 V. Again, if the thickness $h_8$ is approximately 9 μm and the doping level of the bottom epitaxial layer 8 is approximately $1 \cdot 10^{15}$ cm$^{-3}$, then the maximum voltage is approximately equal to 1500 V. In an embodiment, the maximum voltage is directly proportional to the thickness $h_8$ and is inversely proportional to the doping level of the bottom epitaxial layer 8.

The intermediate epitaxial layer 10 is optional, has a thickness $h_{10}$ for example approximately equal to 0.2 μm, and moreover has a doping level for example, between approximately $5 \cdot 10^{15}$ cm$^{-3}$ and $5 \cdot 10^{16}$ cm$^{-3}$. Furthermore, the intermediate epitaxial layer 10 defines an intermediate surface $S_{10}$, and performs the function of reducing the on-resistance of the trench MOSFET 1.

The body 2 of the trench MOSFET 1 further includes a top epitaxial layer 12, which is made of silicon and is of a P type. In detail, the top epitaxial layer 12 defines a top surface $S_{12}$ and extends over the intermediate surface $S_{10}$, in direct contact with the intermediate epitaxial layer 10. Furthermore, the top epitaxial layer 12 has a thickness $h_{12}$, for example, in the range between approximately 1 μm and 2 μm; again, the top epitaxial layer 12 has a doping level, for example, in the range between approximately $1 \cdot 10^{17}$ cm$^{-3}$ and $5 \cdot 10^{17}$ cm$^{-3}$. Operatively, the top epitaxial layer 12 functions as body region.

In practice, the body 2 of semiconductor material is delimited by the top surface $S_{12}$ and by the bottom surface $S_1$. Furthermore, underneath the intermediate surface $S_{10}$ there extend a first semiconductor region 14a and a second semiconductor region 14b, both of a P+ type, which function, respectively, as first and second deep body regions 14a, 14b.

In detail, the first and second semiconductor regions 14a, 14b are set laterally at a distance apart so as to define an internal region 16 set between them.

In greater detail, the first and second semiconductor regions 14a, 14b extend, starting from the intermediate surface $S_{10}$, with a depth $h_{14}$ greater than the thickness $h_{10}$, hence greater than approximately 0.2 μm, but less than $h_8+h_{10}$. In other words, the first and second semiconductor regions 14a, 14b traverse completely the intermediate epitaxial layer 10 and extend partially within the bottom epitaxial layer 8. Furthermore, the first and second semiconductor regions 14a, 14b have an average doping level $N_{a\_14}$ such that:

$$h_{14} > 2 \cdot \in \cdot E_c / (q \cdot N_{a\_14}) \tag{1}$$

where $\in$ is the absolute dielectric permittivity of silicon carbide, $E_c$ is the critical electrical field of silicon carbide, and q is the charge of an electron. For example, the thickness $h_{14}$ may be equal to approximately 0.4 μm, and the average doping level $N_{a\_14}$ may be in the range between approximately $1 \cdot 10^{18}$ cm$^{-3}$ and $5 \cdot 10^{18}$ cm$^{-3}$.

The trench MOSFET 1 further includes a trench 20, which extends from the top surface $S_{12}$ and has a thickness $h_{20} > h_{12}+h_{10}$. In other words, the trench 20 extends through the top epitaxial layer 12 and the intermediate epitaxial layer 10 until it contacts the bottom epitaxial layer 8. Furthermore, the trench 20 is set at a distance apart laterally with respect to the first and second semiconductor regions 14a, 14b so as to extend within the internal region 16 without contacting the first and second semiconductor regions 14a, 14b, which are approximately equidistant from the trench 20.

In detail, the trench 20 is delimited by a wall 22, and the first and second semiconductor regions 14a, 14b are both at approximately a distance d from the wall 22. In practice, if we designate by $w_{20}$ the width of the trench 20 and by $w_{16}$ the width of the internal region 16, we have $w_{16} \approx w_{20}+2d$.

Figure 2:
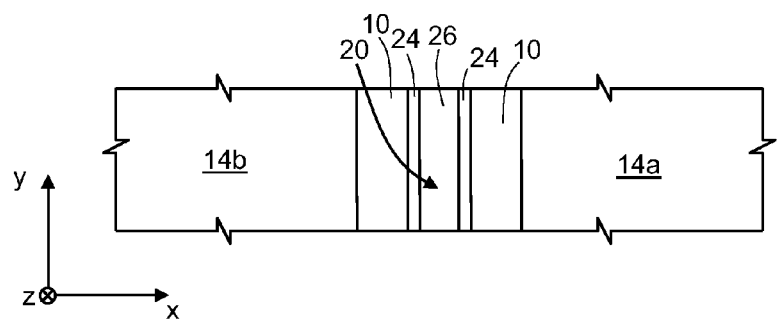
FIGS. 2, 3 show top plan views of cross sections of trench MOSFETs having the cross section illustrated in FIG. 1, taken along respective lines of section II-II and III-III indicated in FIG. 1.

As illustrated also in FIG. 2, the wall 22 is coated internally with a first oxide layer 24. Furthermore, present within the trench 20 is a first gate region 26, which is in direct contact with the first oxide layer 24 and is made of polysilicon.

The trench MOSFET 1 further includes a first dielectric region 30, which is deposited on the top surface $S_{12}$, is vertically aligned with the trench 20, and is in direct contact with the first oxide layer 24 and with the first gate region 26.

Furthermore, the trench MOSFET 1 includes a source region 32, formed by a first source subregion 32a and a second source subregion 32b, which are set laterally at a distance apart and are both of an N+ type and with a doping level of approximately $10^{19}$ cm$^{-3}$. In detail, the first and second source subregions 32a, 32b extend from the top surface $S_{12}$, on opposite sides with respect to the trench 20. Furthermore, the first and second source subregions 32a, 32b contact the first oxide layer 24, as well as the first dielectric region 30.

The trench MOSFET 1 further includes a top metallization 34 and a bottom metallization 36, as well as a gate metallization, the latter (not shown) contacting in a way in itself known the first gate region 26.

In detail, the top metallization 34 functions as source metallization and extends over the top surface $S_{12}$, in direct contact with the top epitaxial layer 12, so as to surround the first dielectric region 30. Furthermore, the source metallization 34 is in direct contact with the first and second source subregions 32a, 32b.

The bottom metallization 36 functions as a drain metallization and extends underneath the bottom surface $S_1$ of the substrate 4, with which it is in direct contact. In practice, the substrate 4, the buffer layer 6, and the bottom epitaxial layer 8 function as drain region.

Operatively, the first gate region 26, the first oxide layer 24, and the top epitaxial layer 12 form a junction of the metal-oxide-semiconductor type; hence, by biasing in a way in itself known the top metallization 34 and the gate metallization, it is possible to form a channel of an N type within the top epitaxial layer 12, and in particular in a region of the top epitaxial layer 12 set in direct contact with the first oxide layer 24. Furthermore, by biasing in a way in itself known the top metallization 34 and the bottom metallization 36 with a voltage $V_{DS}$, it is possible to generate a current $I_{DS}$.

The current $I_{DS}$ flows between the top metallization 34 and the bottom metallization 36, and hence has a vertical direction and flows both through the silicon and through the silicon carbide. In particular, the current $I_{DS}$ flows within the channel of an N type, traversing the top epitaxial layer 12; moreover, the current $I_{DS}$ traverses the substrate 4, the buffer layer 6, as well as the bottom epitaxial layer 8 and the intermediate epitaxial layer 10.

In practice, the current $I_{DS}$ encounters a resistor, the resistance of which depends, among other things, upon the area of a section of the internal region 16, said section lying in a plane parallel to the plane xy of the reference system xyz illustrated in FIG. 1. In particular, the resistance depends upon the area of the cross section of the internal region 16 having minimum area.

In the case where the voltage $V_{DS}$ is such as to reversely bias the PN junction present between the top epitaxial layer 12 and the intermediate epitaxial layer 10, and hence also the PN junction present between the bottom epitaxial layer 8 and the first and second deep body regions 14a, 14b, the magnitude of the voltage $V_{DS}$ cannot exceed a maximum voltage $V_{max}$; otherwise, a phenomenon of breakdown within the trench MOSFET 1 would be triggered.

In particular, the maximum voltage $V_{max}$ is particularly high thanks to the presence, within the intermediate epitaxial layer 10 and part of the bottom epitaxial layer 8, of the first and second semiconductor regions 14a, 14b.

In fact, assuming for reasons of simplicity that the source region 32 and the first gate region 26 are short-circuited, the thickness $h_{14}$ and the doping of the first and second semiconductor regions 14a, 14b are such that the voltage $V_{DS}$ falls substantially within the first and second semiconductor regions 14a, 14b, as well as within the bottom epitaxial layer 8 and the buffer layer 6. In other words, a nonzero electrical field is generated only within the first and second semiconductor regions 14a, 14b, within the bottom epitaxial layer 8, and within the buffer layer 6; instead, within the top epitaxial layer 12, the electrical field is to a first approximation negligible. Consequently, the maximum voltage $V_{max}$ is limited at the top, instead of by the critical electrical field of silicon, by the critical electrical field of silicon carbide, which, as has been said, is higher than the critical electrical field of silicon.

In greater detail, with regard to the top epitaxial layer 12, the electrical field present therein is negligible not only in the proximity of the first and second semiconductor regions 14a, 14b, but also in the proximity of the internal region 16, i.e., where the top epitaxial layer 12 is not in direct contact with the first and second semiconductor regions 14a, 14b.

In fact, as illustrated qualitatively in FIG. 1, underneath the first and second semiconductor regions 14a, 14b, the equipotential lines L that are generated within the trench MOSFET 1 are approximately parallel to the first and second semiconductor regions 14a, 14b. Instead, in the internal region 16, the equipotential lines L bend, on account of the presence of the trench 20, and in particular of the first oxide layer 24, in such a way that the electrical field itself assumes a direction to a first approximation parallel to the intermediate surface $S_{10}$.

From a more quantitative standpoint, in order to reduce the electrical field present in the portions of top epitaxial layer 12 set facing the internal region 16, one may impose $d<h_8$.

Figure 3:
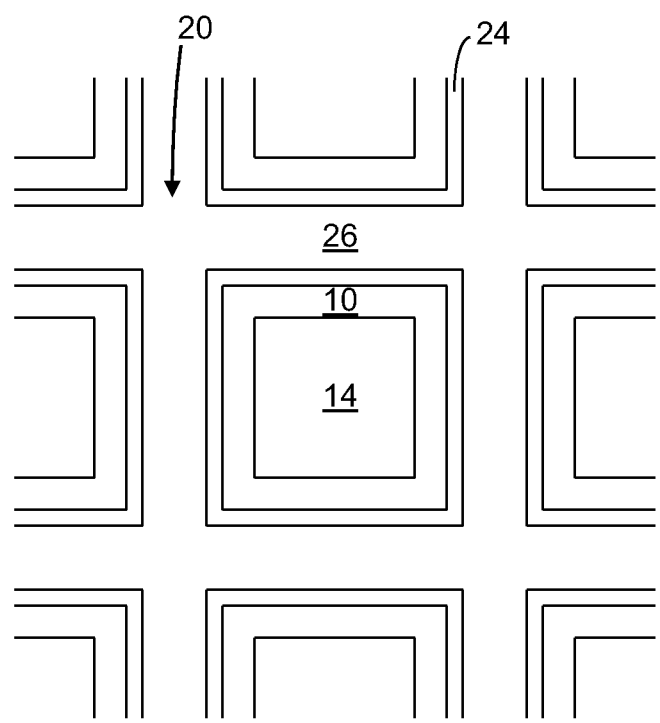

As illustrated in FIG. 3, unlike the embodiment illustrated in FIG. 2, where, in top plan view, both the trench 20 (and consequently also the first gate region 26) and the first and second semiconductor regions 14a, 14b have an elongated rectangular shape and extend parallel to one another. Likewise possible is an embodiment in which the trench 20 forms a square or hexagonal mesh (square mesh shown in FIG. 3).

Figure 4:
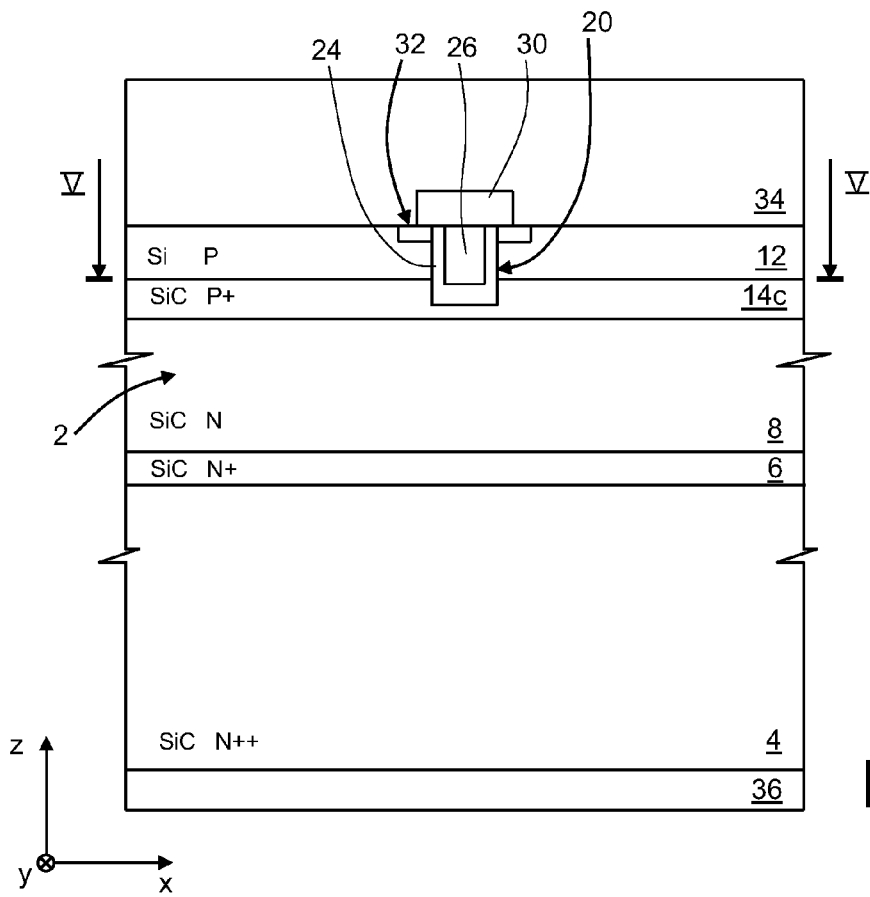
FIG. 4 shows a cross section of a different trench MOSFET.
Figure 5:
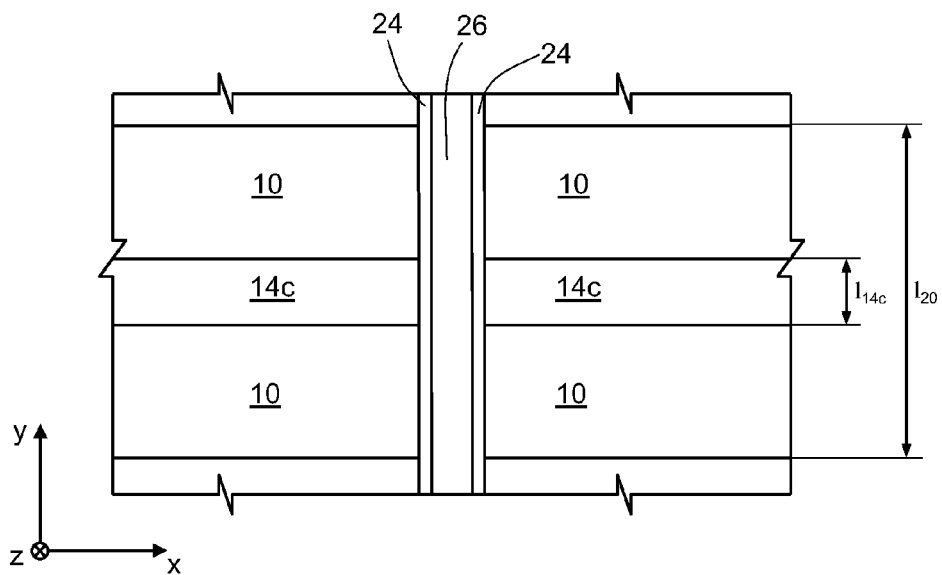
FIG. 5 shows a top plan view of a cross section of the trench MOSFET illustrated in FIG. 4, taken along a line of section V-V illustrated in FIG. 4.

As illustrated in FIG. 4, it may moreover be possible for the trench 20 to extend vertically until it traverses at least partially the common body region 14c in such a way that the first oxide layer 24 contacts, in part, the same common body region 14c. Furthermore, as illustrated in FIG. 5, it may be possible for the common body region 14c to extend along the axis y with a length $I_{14c}$ shorter than the length $I_{20}$ of extension of the trench 20 along the axis y, the latter length $I_{20}$ being possibly delimited by a first additional common body region and a second additional common body region (not shown) of a first additional trench MOSFET and a second additional trench MOSFET (not shown), which are also integrated in the substrate 4.

Figure 6:
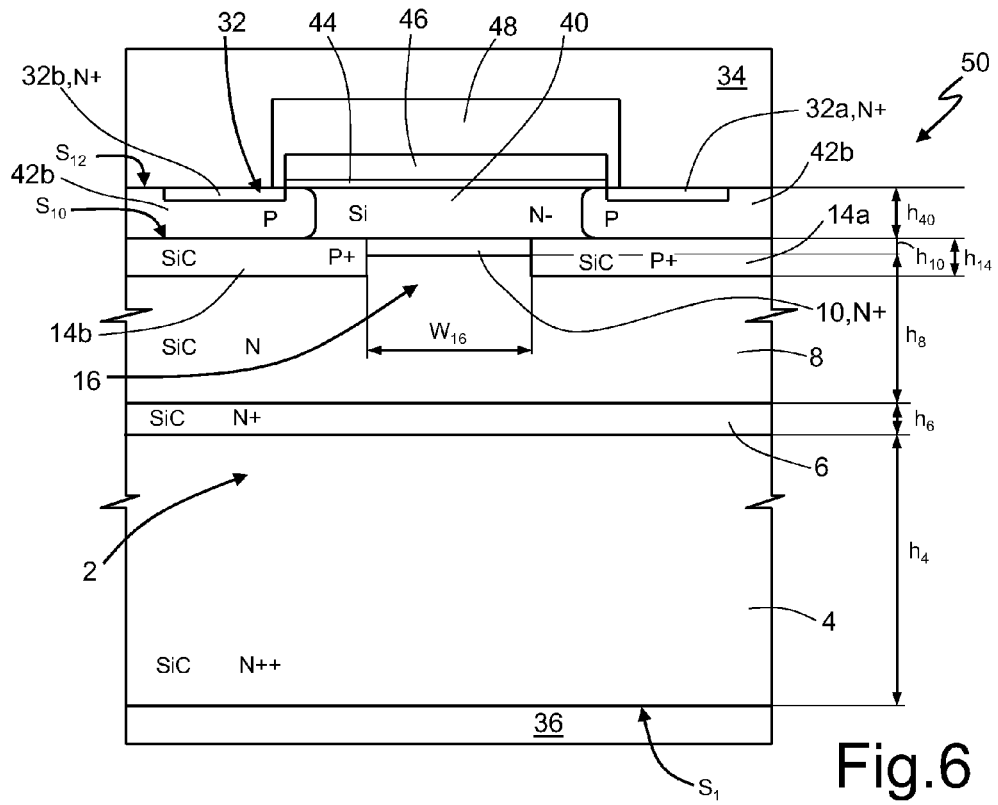
FIG. 6 shows a cross section of a planar MOSFET.

FIG. 6 illustrates a different embodiment of a vertical-conduction integrated electronic device, which, in the case in point, forms a planar MOSFET 50, described in what follows. Elements already present in the embodiments illustrated in FIGS. 1-5 are designated by the same reference numbers; moreover, the ensuing description is limited to the differences of the planar MOSFET 50 with respect to the trench MOSFET 1 illustrated in FIG. 1.

In detail, instead of the top epitaxial layer 12, the planar MOSFET 50 has an alternative epitaxial layer 40, which is made of silicon and is of an N− type.

In greater detail, the alternative epitaxial layer defines the top surface $S_{12}$ and extends over the intermediate surface $S_{10}$, in direct contact with the intermediate epitaxial layer 10 and with the first and second semiconductor regions 14a, 14b.

Furthermore, the alternative epitaxial layer 40 has a thickness $h_{40}$, for example, in the range approximately between 1 μm and 2 μm; again, the alternative epitaxial layer 40 has a doping level, for example, in the range approximately between $1 \cdot 10^{15}$ cm$^{-3}$ and $1 \cdot 10^{16}$ cm$^{-3}$.

Furthermore, the planar MOSFET 50 includes a first top region 42a and a second top region 42b of a P type, which function as the first vertical body region 42a and the second vertical body region 42b, respectively.

In detail, the first and second top regions 42a, 42b are set laterally at a distance apart and are set, respectively, underneath and in direct contact with the first and second source subregions 32a, 32b, which, as has been said, are of an N+ type. In greater detail, the first and second top regions 42a, 42b surround the first source subregion 32a and the second source subregion 32b, respectively, and extend vertically through the alternative epitaxial layer 40 until they contact the first semiconductor region 14a and second semiconductor region 14b, respectively. Furthermore, the first and second top regions 42a, 42b have a doping level, for example, approximately between $5 \cdot 10^{16}$ cm$^{-3}$ and $5 \cdot 10^{17}$ cm$^{-3}$.

A second oxide layer 44 extends over the top surface $S_{12}$; in particular, the second oxide layer 44 extends on top of, and in direct contact with, a portion of the alternative epitaxial layer 40 set between the first and second top regions 42a, 42b.

Extending on top of, and in direct contact with, the second oxide layer 44 is a second gate region 46, made of polysilicon and overlaid, in turn, by a second dielectric region 48.

As illustrated in FIG. 6, also the planar MOSFET 50 comprises the top metallization 34, the bottom metallization 36, as well as the gate metallization, the latter (not shown) contacting in a known way the second gate region 46. In particular, the top metallization 34 extends over the second dielectric region 48 and is in direct contact with the first and second source subregions 32a, 32b, as well as with the first and second top regions 42a, 42b. In other words, the top metallization 34 functions once again as source metallization.

Operatively, the second gate region 46, the second oxide layer 44, and the alternative epitaxial layer 40 form a junction of the metal-oxide-semiconductor type; consequently, by biasing in a way in itself known the source region 32 and the second gate region 46, it is possible to form, underneath the second oxide layer 44, a channel of an N type. In particular, the channel of an N type extends within portions of the first and second top regions 42a, 42b in contact with the second oxide layer 44 and disposed between the first and second source subregions 32a, 32b.

Furthermore, by biasing the top metallization 34 and the bottom metallization 36 with the voltage $V_{DS}$, it is possible to generate the current $I_{DS}$, which flows vertically, traversing the internal region 16, in a way similar to what has been described previously. In order to reduce the electrical field present in the portions of alternative epitaxial layer 40 set facing the internal region 16, one may impose $w_{16} < 2 \cdot h_8$.

Figure 7:
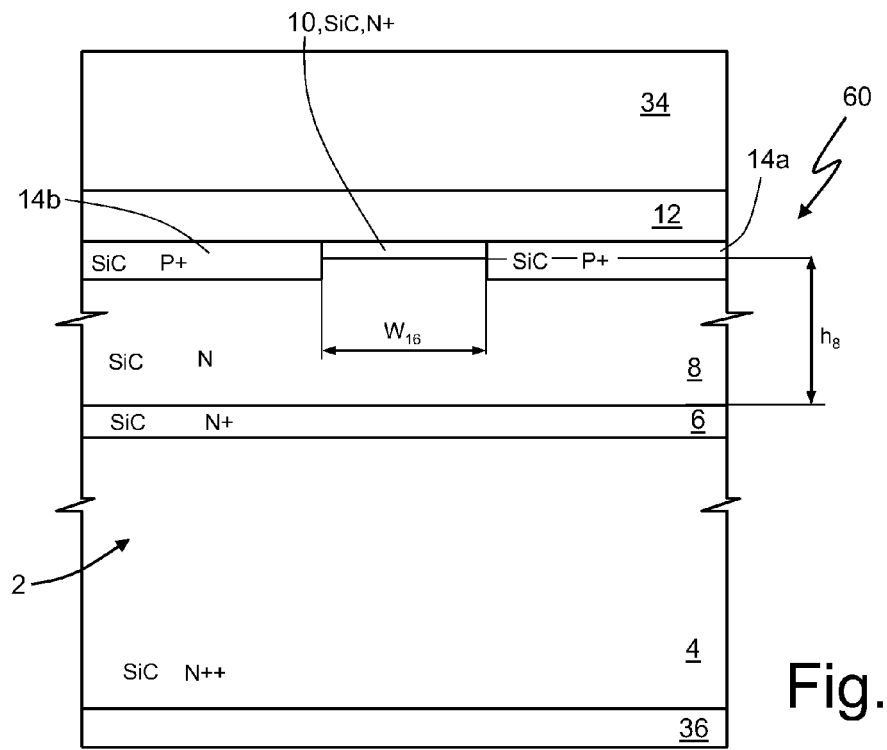
FIG. 7 shows a cross section of a junction diode.
Figure 8:
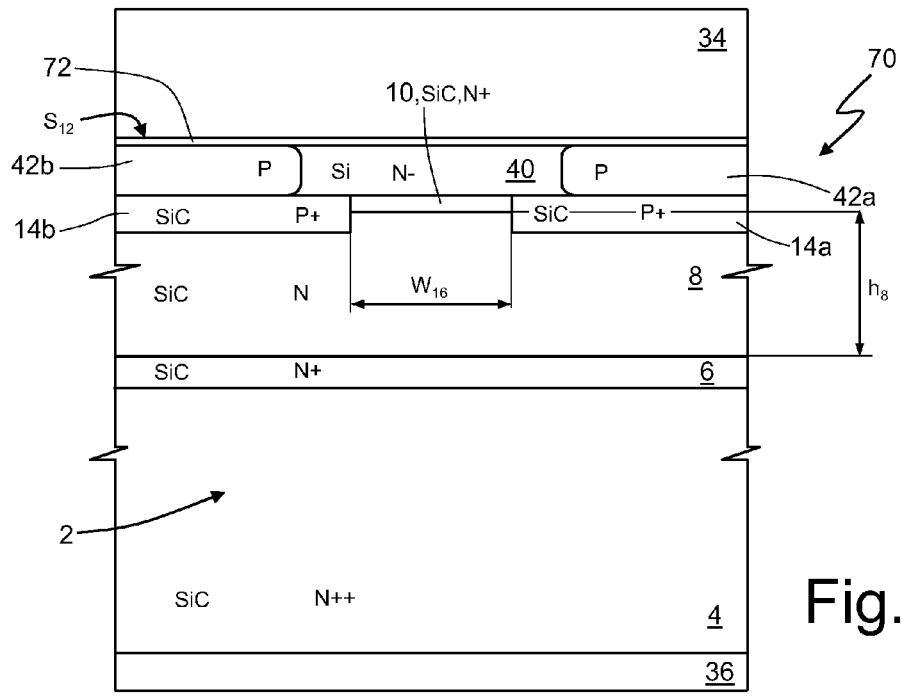
FIG. 8 shows a cross section of a junction-barrier Schottky diode.
Figure 9:
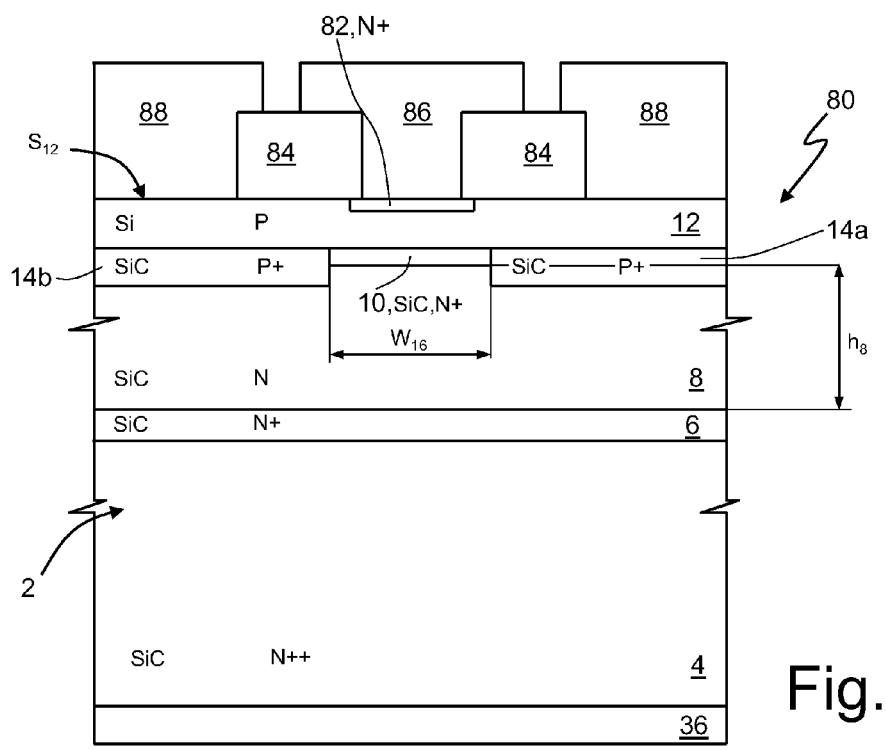
FIG. 9 shows a cross section of a bipolar junction transistor.

According to further embodiments of a vertical-conduction integrated electronic device, the latter may form, for example, a junction diode 60, a junction-barrier Schottky (JBS) diode 70, or a bipolar junction transistor (BJT) 80, as illustrated, respectively, in FIGS. 7, 8, and 9. Said junction diode 60, JBS diode 70, and BJT 80 are described in what follows.

In particular, referring to FIG. 7, an embodiment of the junction diode 60 is described limitedly to the differences between said junction diode 60 and the trench MOSFET 1 illustrated in FIG. 1. Furthermore, elements of the junction diode 60 already present in FIG. 1 are designated by the same reference numbers.

In detail, the junction diode 60 is without the trench 20, and consequently also without the first gate region 26 and the first oxide layer 24, as well as the first dielectric region 30 and the source region 32. In practice, the top epitaxial layer 12 functions as an anode region, whilst the buffer layer 6, the bottom epitaxial layer 8, and the intermediate epitaxial layer 10 function as a cathode region; the first and second semiconductor regions 14a, 14b function instead as deep anode regions. Likewise, the top metallization 34 functions as an anode metallization, whilst the bottom metallization 36 functions as a cathode metallization, with consequent vertical current conduction.

Referring to FIG. 8, as regards, instead, an embodiment of the JBS diode 70, it is described limitedly to the differences between said JBS diode 70 and the planar MOSFET 50 illustrated in FIG. 6. Furthermore, elements of the JBS diode 70 already present in FIG. 6 are designated by the same reference numbers.

In detail, the JBS diode 70 is without the second oxide layer 44, the second gate region 46, and the second dielectric region 48, as well as the first and second source subregions 32a, 32b. Furthermore, the JBS diode 70 includes a metal layer 72, deposited on the top surface $S_{12}$ and in contact with the alternative epitaxial layer 40, with which it forms a Schottky junction.

In practice, the first and second top regions 42a, 42b function as anode regions, whilst the buffer layer 6, the bottom epitaxial layer 8, and the intermediate epitaxial layer 10 function as a cathode region; the first and second semiconductor regions 14a, 14b function instead as first and second deep anode regions. Likewise, the top metallization 34 functions as an anode metallization, whilst the bottom metallization 36 functions as a cathode metallization, with consequent vertical current conduction. In practice, the JBS diode is hence formed by a Schottky diode and by a junction diode set in parallel.

Referring to FIG. 9, as regards, instead, an embodiment of the bipolar junction transistor 80, it is described limitedly to the differences between said bipolar junction transistor 80 and the trench MOSFET 1 illustrated in FIG. 1. Furthermore, elements of the bipolar junction transistor 80 already present in FIG. 1 are designated by the same reference numbers.

In detail, the bipolar junction transistor 80 is without the trench 20, and consequently also without the first gate region 26 and the first oxide layer 24, as well as without the first dielectric region 30. Furthermore, instead of the first and second source subregions 32a, 32b, an emitter region 82 of an N+ type is present, which extends from the top surface $S_{12}$ into the top epitaxial layer 12.

The bipolar junction transistor 80 further includes a third dielectric region 84, which extends on top of the emitter region 82, projecting laterally with respect to said emitter region 82, with which it is in direct contact. Furthermore, the bipolar junction transistor 80 includes an emitter metallization 86 and a base metallization 88.

In detail, the emitter metallization 86 extends on the third dielectric region 84, and moreover traverses the third dielectric region 84, so as to contact the emitter region 82, with which it is vertically aligned. Instead, the base metallization 88 extends on the top surface $S_{12}$ and surrounds the third dielectric region 84; moreover, the base metallization 88 is partially deposited on top of the third dielectric region 84 and is in direct contact with the top epitaxial layer 12.

In practice, the first and second semiconductor regions 14a, 14b function as deep base regions; moreover, the top epitaxial layer 12 functions as a base region, whilst the buffer layer 6, the bottom epitaxial layer 8, and the intermediate epitaxial layer 10 function as a collector region. Consequently, the bottom metallization 36 functions as collector metallization. The bipolar junction transistor 80 described is hence of an NPN type.

An embodiment to a vertical-conduction integrated electronic device may be obtained using an embodiment of the manufacturing method described in what follows and represented in FIGS. 10-19. In particular, the ensuing description regards, without this implying any loss of generality, manufacture of the trench MOSFET 1 illustrated in FIG. 1 and manufacture of the planar transistor 50 illustrated in FIG. 6.

Figure 10:
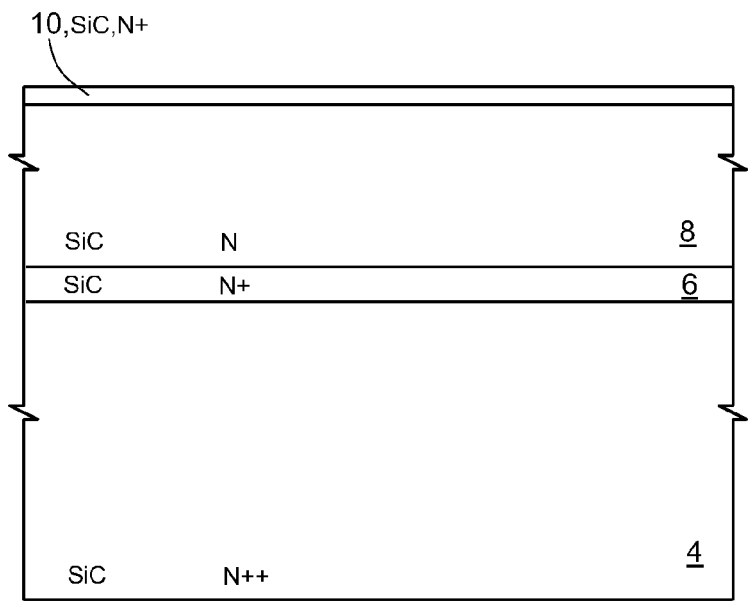
FIGS. 10-19 show cross sections of vertical-conduction integrated electronic device, during successive manufacturing steps.

As illustrated in FIG. 10, to obtain the trench MOSFET 1 the substrate 4 is prepared, and subsequently the buffer layer 6 is formed, as well as the bottom epitaxial layer 8 and the intermediate epitaxial layer 10. In particular, also the buffer layer 6 may be formed by means of epitaxial growth.

Next (FIG. 11), using a first mask 100 made of an appropriate material, for example, silicon oxide or silicon nitride deposited by means of chemical-vapour deposition (CVD) techniques, a sequence of implants of dopant species of a P type (for example, aluminium atoms) is performed, represented by the arrows 102, so as to localize the dopant species in a first thin layer 14a' and a second thin layer 14b' of a P+ type, which are set underneath the intermediate surface $S_{10}$ and are to form, respectively, the first and second semiconductor regions 14a, 14b, once appropriate annealing processes are terminated.

In particular, the sequence of implants is constituted by one or more successive implants, obtained using the same first mask 100. In greater detail, each implant of the sequence of implants is executed with a hot process, i.e., at a temperature higher than approximately 400° C., in order to limit the defects introduced during the implant itself within the crystalline lattice of the silicon carbide. In addition, each implant may be made at a dosage of approximately between $1 \cdot 10^{15}$ cm$^{-2}$ and $1 \cdot 10^{16}$ cm$^{-2}$ and in an energy range of approximately between 20 keV and 200 keV.

Next (FIG. 12), the first mask 100 is removed, and an annealing is executed at a temperature of approximately between 1600° C. and 1850° C., and with a duration of approximately between 10 and 100 minutes, in order to reduce the sites of the bottom epitaxial layer 8 and of the intermediate epitaxial layer 10 damaged following upon the previous ion-implantation process, as well as to activate the dopant species. In practice, annealing may be carried out at a temperature sufficient to activate an appropriate amount of dopant in such a way that the first and second thin layers 14a', 14b' form, respectively, the first and second semiconductor regions 14a, 14b.

Next (FIG. 13), the top epitaxial layer 12 made of silicon is formed by means of hetero-epitaxy.

Then (FIG. 14), using a second resist mask 104, an implantation of dopant species of an N type is performed (for example, phosphorus or arsenic), represented by the arrows 106, so as to localize the dopant species in a third thin layer 32' of an N+ type, which is located underneath the top surface $S_{12}$ and is to form the first and second source subregions 32a, 32b, once appropriate annealing processes are terminated. In greater detail, said implant may be made with a dosage comprised in the range approximately between $1 \cdot 10^{15}$ cm$^{-2}$ and $1 \cdot 10^{16}$ cm$^{-2}$ and with energy comprised in the range approximately between 10 keV and 100 keV.

In a way in itself known, and hence not illustrated or described in detail, the trench 20 is then formed by means of chemical etching. Next, the trench 20 is coated internally with the first oxide layer 24, and subsequently filled with polysilicon to form the first gate region 26. Once again in a way in itself known, and hence not illustrated, the first dielectric region 30 is then formed, and then the top metallization 34, the bottom metallization 36, and the gate metallization are formed.

Figure 11:
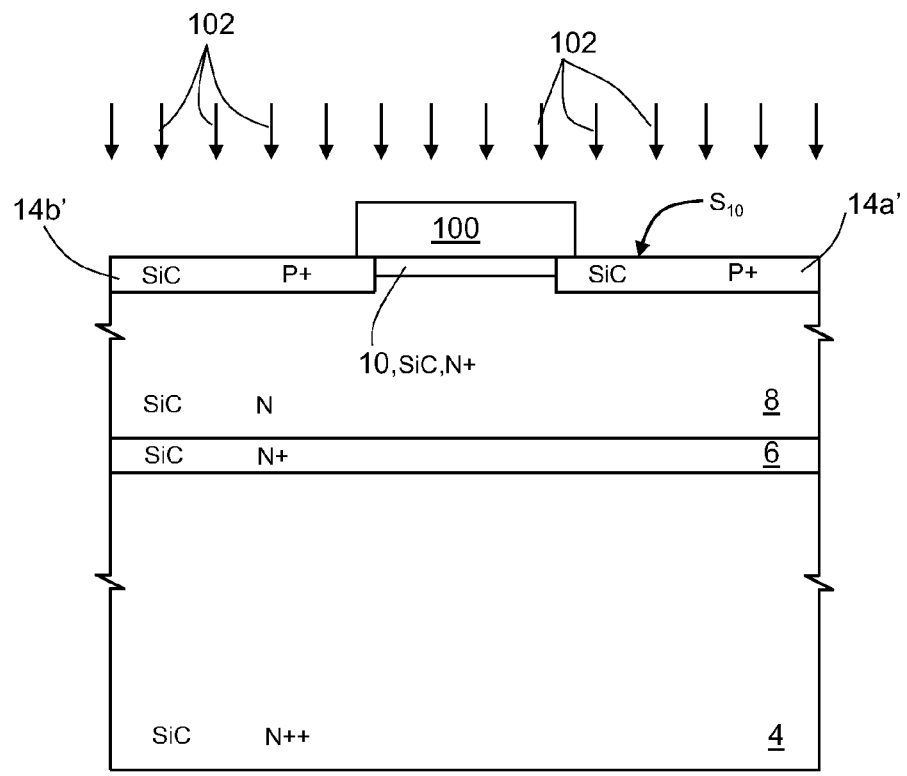
Figure 12:
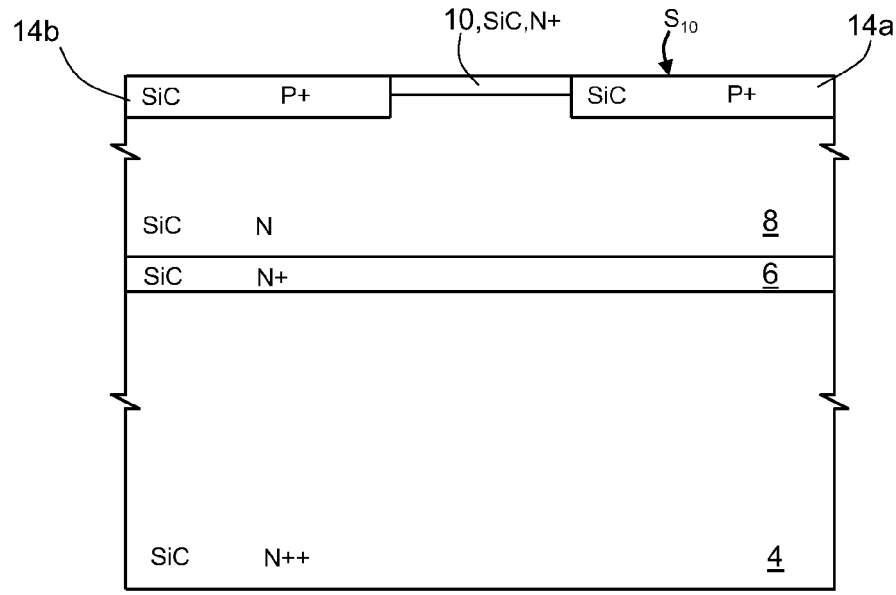
Figure 13:
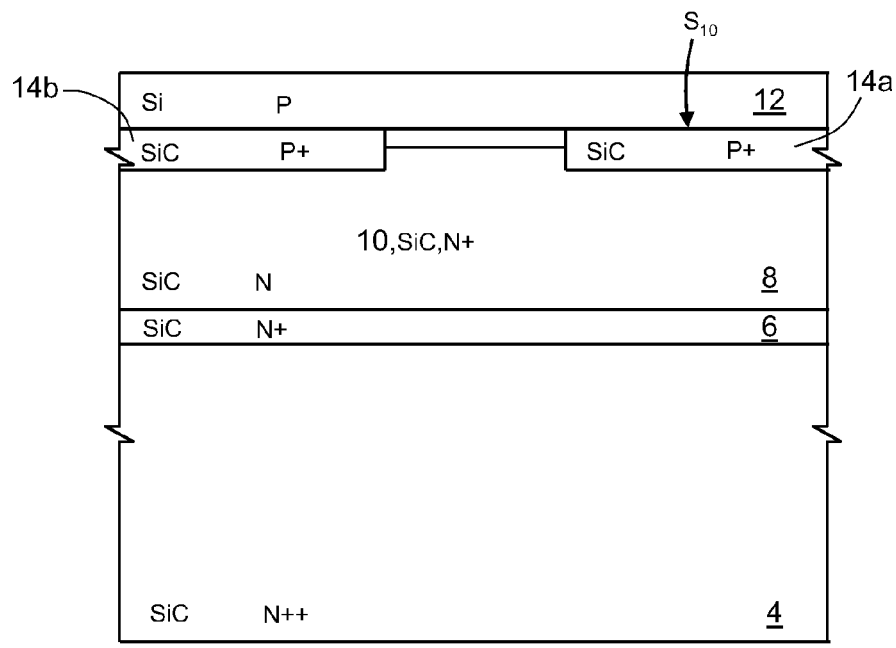
Figure 14:
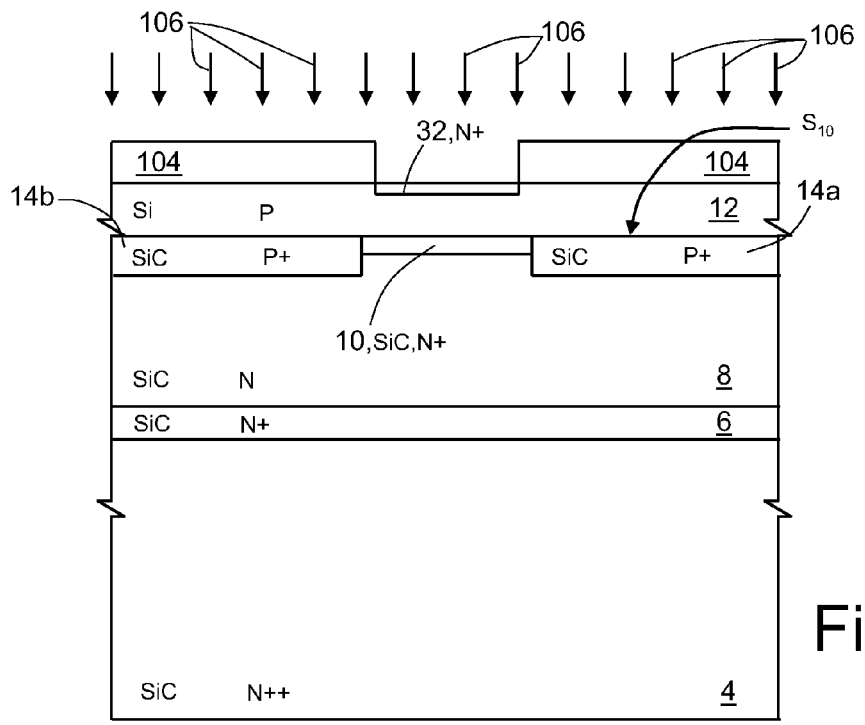
Figure 15:
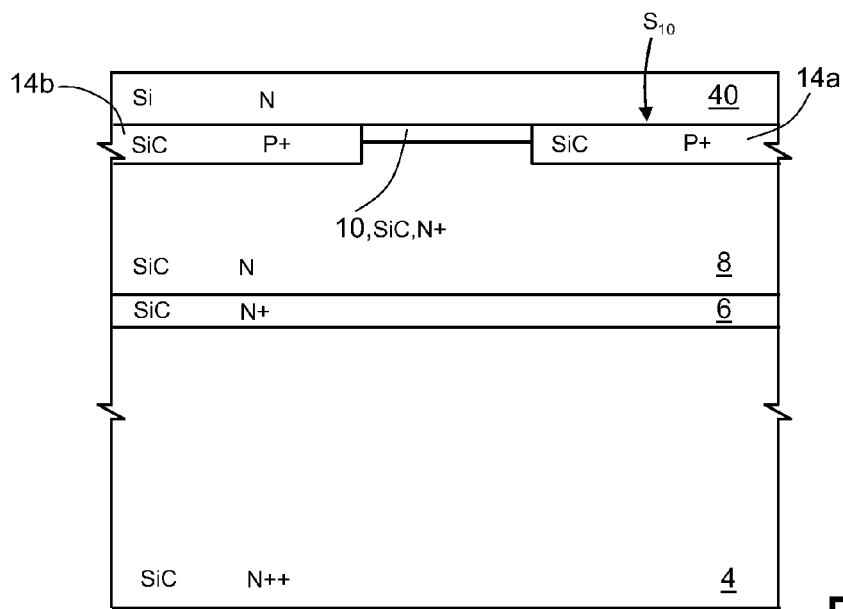
Figure 16:
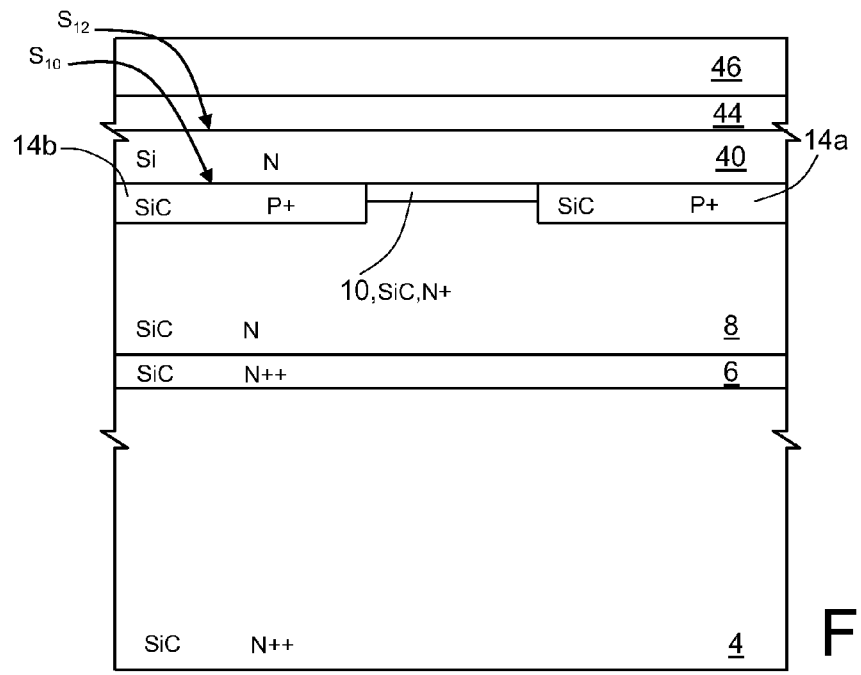
Figure 17:
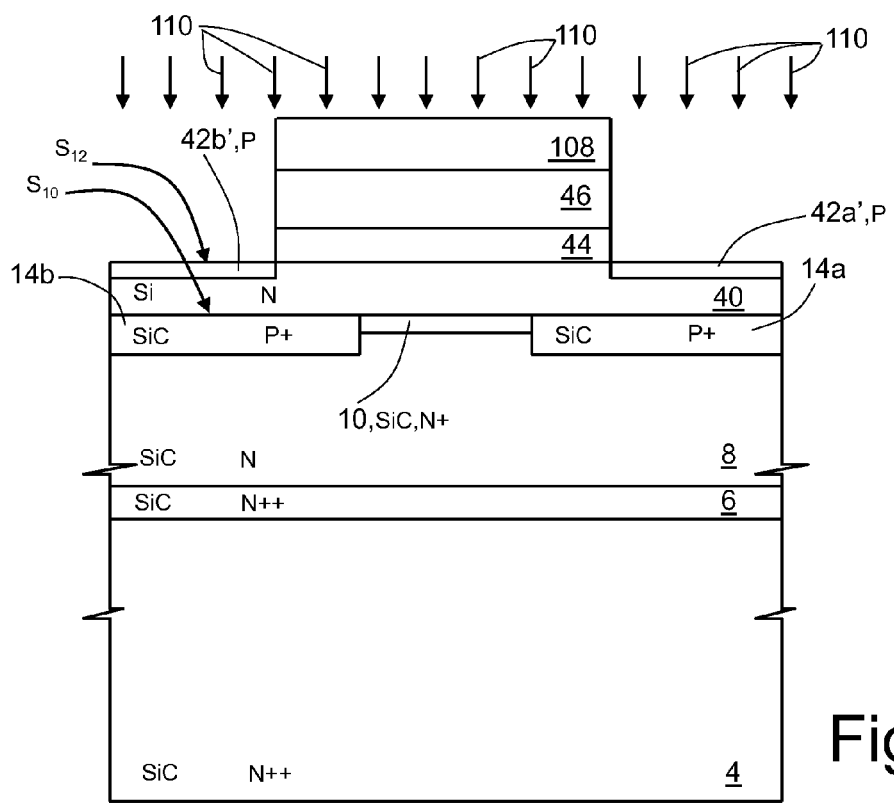
Figure 18:
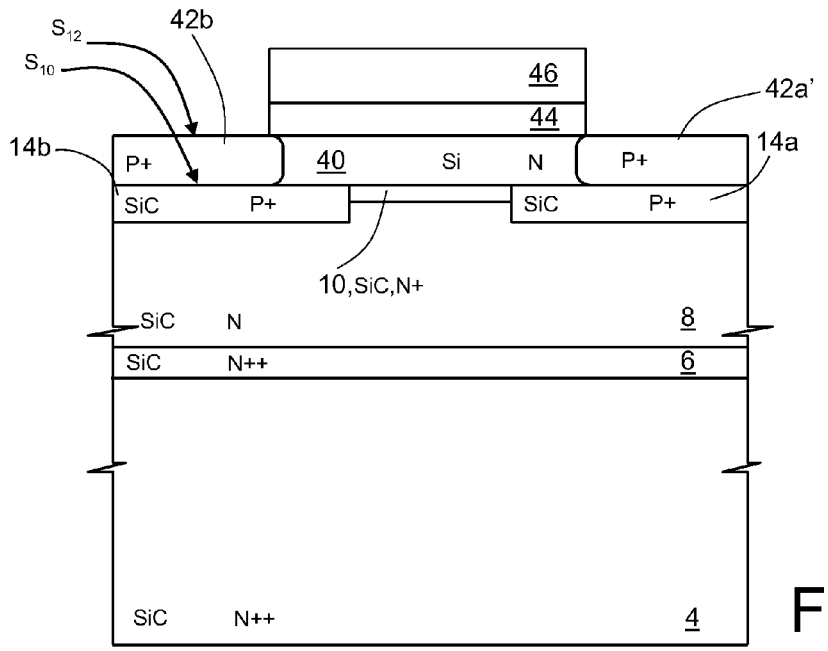
Figure 19:
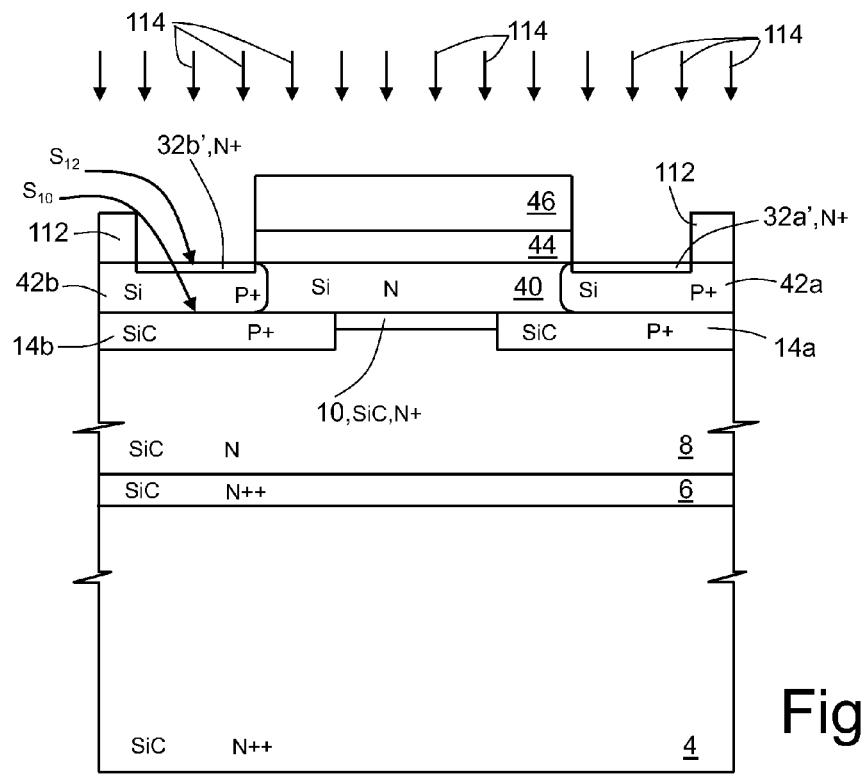

With regard to the planar transistor 50, to manufacture it, it may be possible to perform the operations illustrated in FIGS. 10-12 and described previously.

Next (FIG. 15), hence after carrying out annealing at a temperature of approximately between 1600° C. and 1850° C., the alternative epitaxial layer 40, made of silicon, is formed by means of hetero-epitaxy.

Then (FIG. 16), the second oxide layer 44 is grown thermally, and the polysilicon that forms the second gate region 46 is deposited.

Next (FIG. 17), the second oxide layer 44 and the deposited polysilicon are selectively removed, by means of chemical plasma etching and/or dipping, and, by means of a third resist mask 108, an implantation of dopant species of a P type (for example, boron, indium, or aluminium) is performed, represented by the arrows 110, so as to localize the dopant species in a fourth thin layer 42a' and a fifth thin layer 42b' of a P type, which are located underneath the top surface $S_{12}$ and are to form, respectively, the first and second top regions 42a, 42b, once appropriate annealing processes are terminated.

Next (FIG. 18), the third resist mask 108 is removed and an annealing is carried out at a temperature comprised in the range approximately between 950° C. and 1100° C., and with a duration of approximately between 60 and 300 minutes, so as to activate the dopant species. Said annealing causes an increase in the thickness of the fourth and fifth thin layers 42a' and 42b', which form, respectively, the first and second top regions 42a, 42b. In greater detail, said implant may be made with a dosage in the range approximately between $1 \cdot 10^{12}$ cm$^{-2}$ and $1 \cdot 10^{14}$ cm$^{-2}$ and with an energy in the range approximately between 10 keV and 300 keV.

Next (FIG. 19), by means of a fourth resist mask 112, an implantation of dopant species of an N type is performed, represented by the arrows 114, so as to localize the dopant species in a sixth thin layer 32a' and a seventh thin layer 32b' of an N+ type, which are located underneath the top surface $S_{12}$ and are to form the first and second source subregions 32a, 32b, once appropriate annealing processes are terminated. In greater detail, said implant may be made with a dosage comprised in the range approximately between $1 \cdot 10^{15}$ and $1 \cdot 10^{16}$ cm$^{-2}$ and with energy comprised in the range approximately between 10 and 100 keV.

A subsequent annealing, as well as formation of the second dielectric region 48, of the top metallization 34, and of the bottom metallization 36, finally lead to formation of the planar MOSFET 50.

Advantages that an embodiment of the present integrated electronic device and the present manufacturing method afford emerge clearly from the foregoing discussion.

In particular, an embodiment of the present integrated electronic device uses the properties of silicon carbide (wide bandgap) to confine the electrical field within the epitaxial silicon-carbide layers.

Figure 20:
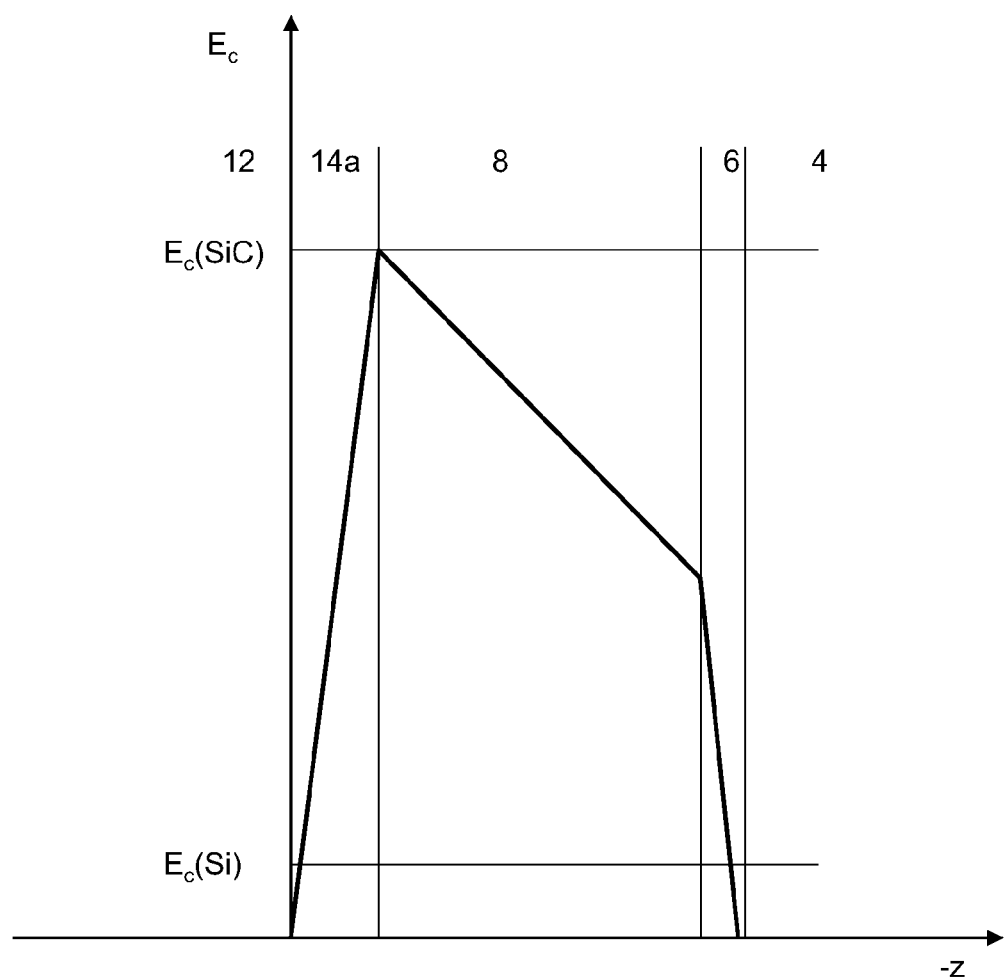
FIG. 20 shows qualitatively a pattern of an electrical field in a portion of a cross section of the trench MOSFET illustrated in FIG. 1, taken along a line of section XX-XX indicated in FIG. 1.

In this connection, FIG. 20 shows qualitatively a pattern of the electrical field along a portion of a cross section of an embodiment of the trench MOSFET 1 parallel to the axis z of the reference system xyz. The pattern highlights how the electrical field is substantially zero in the substrate 4 and in the top epitaxial layer 12, and is maximum at the interface between the first (second) semiconductor region 14a (14b) and the bottom epitaxial layer 8.

Furthermore, an embodiment of the present integrated electronic device benefits from the high mobility μ of the silicon carriers, as well as the high quality (in terms of low degree of defectiveness) that characterizes the silicon-oxide interfaces. In fact, with reference, for example, to an embodiment of the trench MOSFET 1, the current $I_{DS}$ flows both through the silicon and through the silicon carbide, benefiting from the high mobility μ of the carriers in silicon and the low resistance opposed by silicon carbide.

In addition, according to an embodiment of the present manufacturing method, the annealing processes at high temperatures for formation of the first and second semiconductor regions 14a, 14b are carried out prior to formation of the silicon layers, hence without any danger of melting the silicon.

Finally, it is evident that modifications and variations may be made to the described embodiments of the present integrated electronic device and manufacturing method, without thereby departing from the scope of the present disclosure.

For example, with reference once again, without this implying any loss of generality, to an embodiment of the trench MOSFET 1, the top epitaxial layer 12 may be formed starting from a silicon layer of an N type, with subsequent implantation of dopant species of a P type; in this case, the implanted portions of top epitaxial layer 12 function as body region. Likewise, as regards the bipolar junction transistor 80, instead of the top epitaxial layer 12, an epitaxial layer of an N type may be present, which houses a region of a P type, which functions as base region.

It may moreover be possible to reverse all the types of the semiconductor elements described, and/or use different semiconductor materials, for example, using germanium instead of silicon, or else, once again by way of example, using germanium instead of silicon, and silicon instead of silicon carbide.

Finally, as regards the manufacturing method, it may be possible to form the source region after having dug the trench and without the aid of masks.

In addition, an embodiment of a semiconductor device described above may form, or be part of, an integrated circuit, which may be coupled to one or more other integrated circuits to form a system. At least one of the integrated circuits may include a controller such as a processor, and more than one, or all, of the integrated circuits may be disposed on a same die to form, for example, a system on a chip (SOC).

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A method for manufacturing a vertical-conduction integrated electronic device, comprising:
   providing a substrate made of a first semiconductor material and with a first type of conductivity, the first semiconductor material having a first bandgap;
   forming an epitaxial region made of the first semiconductor material and with the first type of conductivity, which overlies the substrate and defines a first surface;
   forming a first epitaxial layer made of a second semiconductor material, which overlies the first surface and is in direct contact with the epitaxial region, the second semiconductor material having a second bandgap narrower than the first bandgap; and
   forming a deep region of a second type of conductivity underneath the first surface and within the epitaxial region.

2. The manufacturing method according to claim 1, wherein the deep region has a first average doping level $N_{a\_14}$ and a thickness $h_{14}$ such that:

$$h_{14} \geq 2 \cdot \in \cdot E_c/(q \cdot N_{a\_14})$$

where $\in$ is the absolute dielectric permittivity of the first semiconductor material, $E_c$ is the critical electrical field of the first semiconductor material, and q is the charge of the electron.

3. The manufacturing method according to claim 2, wherein the step of forming a deep region comprises executing, after the step of forming an epitaxial region and before the step of forming a first epitaxial layer, the steps of:
   carrying out, at a temperature higher than approximately 400° C., an implantation of dopant species of the second type of conductivity underneath the first surface ($S_{10}$), within the epitaxial region; and then
   carrying out an annealing at a temperature higher than approximately 1600° C.

4. A method, comprising:
   generating a reverse voltage across a semiconductor device having a first semiconductor layer with a first conductivity and a first bandgap and a second semiconductor layer with a conductivity and a second bandgap that is wider than the first bandgap;
   causing a first portion of the reverse voltage to be across the first semiconductor layer; and
   causing a second portion of the reverse voltage to be across the second semiconductor layer, the second portion greater than the first portion.

5. The method of claim 4 wherein the first portion of the reverse voltage is approximately zero volts.

6. The method of claim 4 wherein:
   the first conductivity is P-type; and
   the second conductivity is N-type.

* * * * *